United States Patent
Mize et al.

(10) Patent No.: US 7,791,005 B2
(45) Date of Patent: Sep. 7, 2010

(54) COIL CONSTRUCTIONS CONFIGURED FOR UTILIZATION IN PHYSICAL VAPOR DEPOSITION CHAMBERS, AND METHODS OF FORMING COIL CONSTRUCTIONS

(75) Inventors: John D. Mize, Spokane Valley, WA (US); Kenneth I. Niemela, Deer Park, WA (US); Len Hom, Dublin, CA (US)

(73) Assignee: Honeywell International, Inc., Morristown, NJ (US)

( * ) Notice: Subject to any disclaimer, the term of this patent is extended or adjusted under 35 U.S.C. 154(b) by 1106 days.

(21) Appl. No.: 10/543,562

(22) PCT Filed: Feb. 19, 2004

(86) PCT No.: PCT/US2004/005208
§ 371 (c)(1),
(2), (4) Date: Jul. 27, 2005

(87) PCT Pub. No.: WO2004/079764
PCT Pub. Date: Sep. 16, 2004

(65) Prior Publication Data
US 2006/0124634 A1  Jun. 15, 2006

Related U.S. Application Data

(60) Provisional application No. 60/451,145, filed on Feb. 28, 2003.

(51) Int. Cl.
*H05B 6/36* (2006.01)

(52) U.S. Cl. .................. 219/672; 219/444.1; 118/723 I
(58) Field of Classification Search ................ 219/672, 219/444.1, 541, 121.43, 121.51, 121.52; 118/723 I, 723 VE, 723 IR, 723 AN; 204/298.06, 204/298.34; 315/111.51; 29/610.1, 842, 29/843
See application file for complete search history.

(56) References Cited

U.S. PATENT DOCUMENTS

| | | | |
|---|---|---|---|
| 6,244,210 B1* | 6/2001 | Iacoponi et al. | 118/723 I |
| 6,254,746 B1* | 7/2001 | Subramani et al. | 204/298.11 |
| 6,376,807 B1* | 4/2002 | Hong et al. | 219/444.1 |

* cited by examiner

*Primary Examiner*—Quang T Van
(74) *Attorney, Agent, or Firm*—Sandra P. Thompson; Buchalter Nemer

(57) ABSTRACT

The invention includes coil constructions configured for utilization in PVD chambers, and also includes methods of forming coil constructions suitable for utilization in PVD chambers. The coil constructions can include one or more cup projections extending from an outer periphery of a coil body. The cup projections are one-piece with the coil body, and have a recess extending therein with a projecting lip extending entirely around the recess. The cup projections further comprise a fastener receiver within the recess configured to receive a fastener for connecting the coil with the chamber. The methods of forming the coil construction can include identifying separate components of an assembly associated with a coil replacement kit, and forming a one-piece construction which can be substituted for at least two of the components.

27 Claims, 18 Drawing Sheets

US 7,791,005 B2

COIL CONSTRUCTIONS CONFIGURED FOR UTILIZATION IN PHYSICAL VAPOR DEPOSITION CHAMBERS, AND METHODS OF FORMING COIL CONSTRUCTIONS

RELATED PATENT DATA

This application claims priority to PCT application Serial No. PCT/US04/005208, which was filed Feb. 19, 2004, and which is hereby incorporated by reference; and which claims priority to U.S. Provisional Application Ser. No. 60/451,145, which was filed Feb. 28, 2003 and which is hereby incorporated by reference.

TECHNICAL FIELD

The invention pertains to coil constructions configured for utilization in physical vapor deposition chambers, and also pertains to methods of forming coil constructions.

BACKGROUND OF THE INVENTION

Physical vapor deposition (PVD) is commonly utilized for formation of thin layers. For instance, PVD is commonly utilized for deposition of the thin layers utilized in semiconductor structures, with PVD being particularly useful for deposition of metallic materials. PVD processes are commonly referred to as sputtering processes, in that the processes comprise sputtering of desired materials from a target. The sputtered materials are deposited across a substrate to form a desired thin film.

An exemplary PVD operation is described with reference to an apparatus 110 in FIG. 1. Apparatus 110 is an example of an ion metal plasma (IMP) apparatus, and comprises a chamber 112 having sidewalls 114. Chamber 112 is typically a high vacuum chamber. A target 10 is provided in an upper region of the chamber, and a substrate 118 is provided in a lower region of the chamber. Substrate 118 is retained on a holder 120, which typically comprises an electrostatic chuck. Target 10 would be retained with suitable supporting members (not shown), which can include a power source. An upper shield (not shown) can be provided to shield edges of the target 10. Target 10 can comprise, for example, one or more of aluminum, cadmium, cobalt, copper, gold, indium, molybdenum, nickel, niobium, palladium, platinum, rhenium, ruthenium, silver, tin, tantalum, titanium, tungsten, vanadium and zinc. The elements can be in elemental, compound, or alloy form. The target can be a monolithic target, or can be part of a target/backing plate assembly.

Substrate 118 can comprise, for example, a semiconductor wafer, such as, for example, a single crystal silicon wafer.

Material is sputtered from a surface of target 10 and directed toward substrate 118. The sputtered material is represented by arrows 122.

Generally, the sputtered material will leave the target surface in a number of different directions. This can be problematic, and it is preferred that the sputtered material be directed relatively orthogonally to an upper surface of substrate 118. Accordingly, a focusing coil 126 is provided within chamber 112. The focusing coil can improve the orientation of sputtered materials 122, and is shown directing the sputtering materials relatively orthogonally to the upper surface of substrate 118.

Coil 126 is retained within chamber 112 by pins 128 which are shown extending through sidewalls of the coil and also through sidewalls 114 and chamber 112. Pins 128 are retained with retaining screws 130 in the shown configuration. The schematic illustration of FIG. 1 shows heads 132 of the pins along an interior surface of coil 126, and another set of heads 130 of the retaining screws along the exterior surface of chamber sidewalls 114.

Spacers 140 (which are frequently referred to as cups) extend around pins 128, and are utilized to space coil 126 from sidewalls 114.

The coil 126 is generally provided within the chamber 112 as a kit comprising the pins 128, retaining screws 130, cups 140, and various other components which are not shown in FIG. 1. The coils utilized in such kits will comprise annular rings (referred to herein as annular coil bodies) having openings extending therethrough. FIGS. 2 and 3 illustrate exemplary prior art coil constructions 200 and 250, respectively. Either of the coil constructions 200 or 250 can be utilized for the coil 126 of FIG. 1. Both of the coil constructions are annular rings which are substantially circular (with the term "substantially circular" indicating that the rings are circular to within tolerances of an application process, which includes, but is not limited to, applications in which the rings are circular in a strict mathematical sense).

Coil 200 has an inner periphery 202 and an outer periphery 204; and similarly coil 250 has an inner periphery 252 and an outer periphery 254.

Coil 200 has a plurality of openings 206, 208 and 210 extending therethrough for receipt of pins (such as the pins 128 of FIG. 1) utilized to retain the coil within a PVD chamber. Similarly, coil 250 comprises a plurality of openings 256, 258 and 260 extending therethrough for receipt of pins.

Coil 200 comprises a pair of openings 212 and 214 configured for receipt of a pair of electrode assemblies which provide power to the coil. Openings 212 and 214 are separated from one another by a slot 216. The shape of the slot corresponds to a so-called step-in-and-step-out configuration. The coil 250 of FIG. 3 comprises a pair of openings 262 and 264 configured for receipt of electrodes, and separated from one another by a slot 266. The configuration of the slot 266 of coil 250 corresponds to a "side-by-side" configuration.

FIG. 4 shows a coil to shield attachment of the type described in FIG. 1, but in greater detail than shown in FIG. 1, and with more accuracy to detail. Referring to FIG. 4, identical numbering will be used as was utilized in describing FIG. 1, where appropriate, but it is to be understood that the coil can comprise either coil 200 or coil 250 of FIGS. 2 and 3. FIG. 4 shows coil 126 attached to shield 114 (i.e., to chamber sidewall 114). The attachment utilizes a pin 128 having a threaded interior 129, and a screw 130 retained within such threaded interior. Pin 128 comprises a head 132 which is inset within the inner periphery of coil 126. Screw 130 comprises a head 131 which projects outwardly of shield 114 in the shown configuration.

Pin 128 extends through the electrically conductive cup 140. Pin 128 also extends through an inner conductor 141 which is within cup 140. The cup and inner conductor together form a construction having a projecting lip 143 extending around a recess 145. The pin extends through an opening 147 in the cup and inner conductor.

A dielectric material spacer 151 is provided around the assembly comprising cup 140 and inner conductor 141, and is utilized to space the conductive materials of cup 140 and inner conductor 141 from shield 114. Spacer 151 can comprise any suitable material, and typically comprises one or more ceramic materials. A similar dielectric 153 is within shield 114 to isolate the screw 130 from the shield.

Coil 126 will wear out with time, and kits are provided for replacement of the coil. Such kits will typically comprise a coil having a configuration similar to that shown in either FIG. 2 or 3, together with numerous separate components for attaching the coil to a shield, with such separate components including, for example, pins (such as the pin 128), cups (such as the cup 140), and inner conductors (such as the inner conductor 141). The kit is assembled in order to provide the coil within the chamber. FIG. 5 is a view along an outer periphery of a partially assembled kit. Such view shows the coil 126, cup 140, inner conductor 141 and pin 128. The view of FIG. 5 shows that the lip 143 extends entirely around the recess 145.

The kit utilized for retaining a new coil within a sputtering chamber will typically also comprise assemblies for the electrodes which are to be utilized with the coil. FIG. 6 illustrates a diagrammatic view of an electrode assembly. FIG. 6 shows the coil 126 having an opening 161 extending therethrough, and having a pin 163 within the opening. Opening 161 can correspond to, for example, any of the openings 212, 214, 262 and 264 discussed previously with reference to FIGS. 2 and 3. Pin 163 has a threaded interior periphery 165. A clamp 167 is provided over the pin, and a screw 169 is threadably engaged with the interior periphery 165 of the pin. An appropriate power source would be connected with the electrode and utilized for providing power to coil 126, as is known to persons of ordinary skill in the art.

The coil structures of FIGS. 1-6 are exemplary prior art coil structures. Other coil structures have been constructed. For instance, monolithic coil structures have been constructed in which the electrode assemblies are one-piece with a coil, and in which cups and inner conductors are one-piece with the coil. An advantage of forming the electrodes, cups and inner conductors as one-piece with a coil is that such can eliminate utilization of pins (such as, for example, the pin 128 of FIG. 4 and the pin 163 of FIG. 6), which can eliminate discontinuities along an inner peripheral surface of a coil by eliminating the recessed pinhead otherwise present along the inner periphery of the coil. An advantage of eliminating the discontinuities from the inner periphery of the coil is that such can improve longevity of the coil, and performance of the coil.

The monolithic coil structures produced have been for utilization in modified physical vapor deposition apparatuses. In other words, the monolithic coil assemblies have not corresponded to assemblies which can be substituted for the kit constructions utilized in conventional physical vapor deposition apparatuses, but instead have differences which make them suitable for apparatuses other than the conventional apparatuses described above. For instance, one of the monolithic coil assemblies lacks the lip 143 of FIGS. 4 and 5 which extends entirely around the recess 145, and instead utilizes a lip which extends only partially around such recess.

It would be desirable to develop new configurations for coil constructions.

SUMMARY OF THE INVENTION

In one aspect, the invention encompasses a coil construction configured for utilization in a physical vapor deposition chamber. The construction includes an annular coil body, with the annular coil body having an inner periphery and an opposing outer periphery. The construction also includes one or more cup projections extending form the outer periphery of the annular coil body. At least one of the cup projections is one-piece with the annular coil body, and has a recess extending therein with a projecting lip extending entirely around the recess. The cup projection further includes a fastener receiver within the recess and configured to receive a fastener for connecting the coil with the chamber.

In one aspect, the invention encompasses a method for forming a coil construction suitable for utilization in a physical vapor deposition chamber. A material is provided, and shaped into a piece comprising an annular coil body and at least one cup projection extending from an outer periphery of the annular coil body. The shaping can comprise, for example, casting, cutting, forging, or powder-pressing.

In one aspect, the invention encompasses a method of forming a construction suitable for utilization in a physical vapor deposition chamber. The method comprises identifying separate components of an assembly associated with a coil replacement kit. The components include an annular coil, a cup, a pin and an inner conductor. A one-piece construction is formed which can be substituted for at least two of the components of the coil replacement kit without modification of the physical vapor deposition chamber.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention pertains to a one-piece, coil construction that can be utilized in a physical vapor deposition chamber. As discussed in the "Background" section of this disclosure, the focusing coils utilized with physical vapor deposition chambers have a limited lifetime. The focusing coils are typically replaced utilizing a replacement kit, with such kit including numerous components such as, for example, an annular coil, a plurality of cups, a plurality of pins, and a plurality of inner conductors. An exemplary reaction chamber construction which utilizes a coil replacement kit is the copper 200 millimeter IMP Electra™ Endura sputtering chamber. One aspect of the present invention is to form a one-piece construction which can be substituted for at least two of the components of the replacement kit without modification of the physical vapor deposition chamber.

For purposes of interpreting this disclosure, a one-piece coil construction is a construction formed from a single block of material. As discussed in more detail below, the one-piece construction can be forged from a single plate of material, cut from a single mass of material, cast from a molten material or formed of powder which has been pressed into a single piece of material. In some aspects, which are discussed in more detail below, the invention encompasses utilization of one-piece constructions to eliminate utilization of pins passing through an inner peripheral surface of a focusing coil. In such aspects, the utilization of the one-piece construction can be advantageous in that discontinuities along the coil inner surface can introduce discontinuities into the focusing field produced by the coil, and accordingly the invention can alleviate, and in particular aspects eliminate, such discontinuities in the focusing field.

It can be advantageous to form a coil construction of a single piece, as such can eliminate problems associated with attempting to weld particular materials. For instance, copper generally doesn't weld very easily. Accordingly, it can be particularly advantageous to utilize one-piece constructions when structures contain copper or other materials which are difficult to weld.

Figure 7:
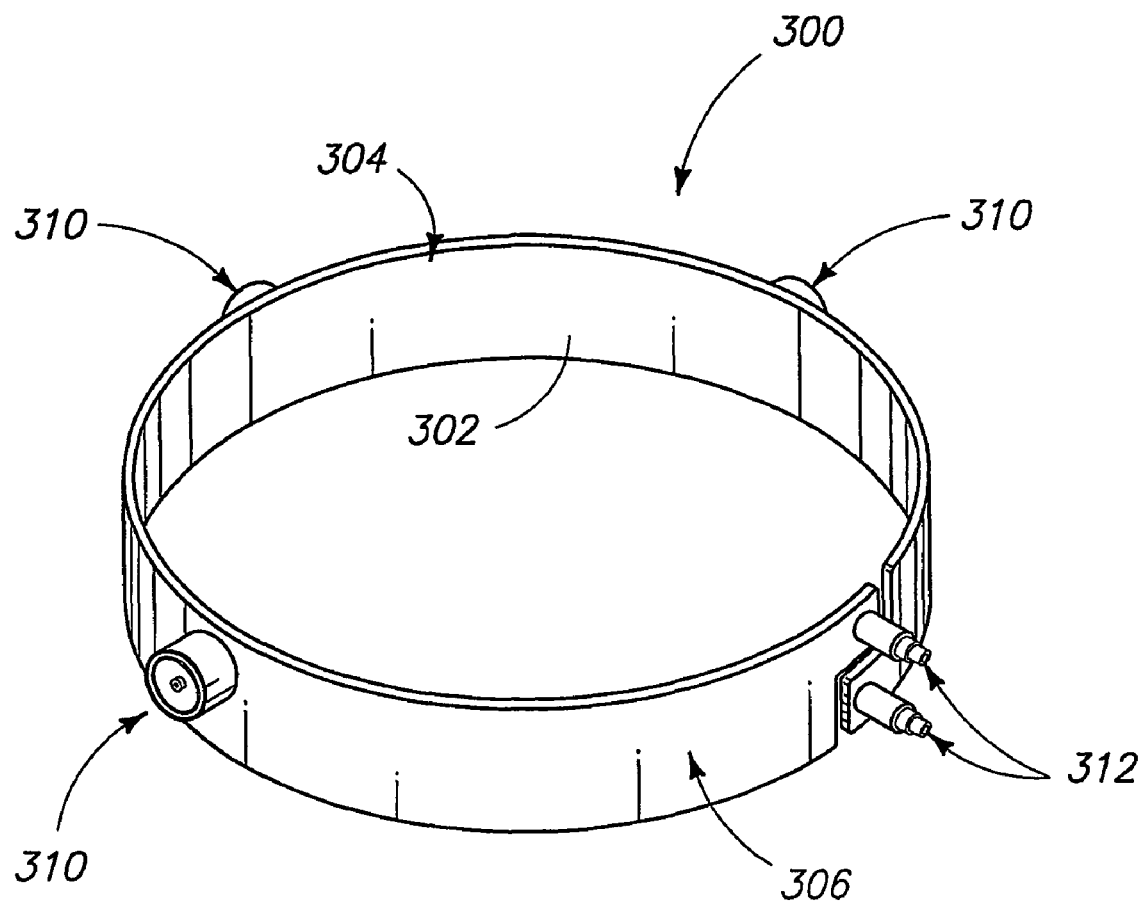
FIG. 7 is a diagrammatic view of an exemplary monolithic coil construction which can be formed in accordance with an aspect of the present invention.

FIG. 7 shows an exemplary one-piece coil construction 300 which can be formed in accordance with an aspect of the present invention. Coil construction 300 comprises an annular coil body 302 having an inner periphery 304 and an opposing outer periphery 306. The shown annular coil body is substantially circular, but it is to be understood that the annular coil body can have other annular shapes. Although the shown annular body has a step-in-and-step-out slit configuration, it is to be understood that the coil body could alternatively have a side-by-side slit configuration in other aspects of the invention (not shown), or could have a different configuration than either the step-in-and-step-out slit configuration or the side-by-side slit configuration, including for example, hybrids of the step-in-and-step-out slit configuration and the side-by-side slit configuration. Such hybrids can have angled slits.

Construction 300 has a plurality of cup projections 310 extending from the outer periphery 306. The shown configuration has three of such cup projections, but it is to be understood that the invention encompasses aspects in which more than three, or less than three, cup projections are provided.

The shown construction can be considered to have one or more cup projections extending from outer periphery 306. Construction 300 further comprises a pair of electrode projections 312 extending from the outer periphery. The cup projections 310 and electrode projections 312 are one-piece with coil body 302.

Construction 300 can comprise any suitable composition. In some aspects the coil will comprise the same composition as a target which is to be utilized in a physical vapor deposition chamber, and in other aspects the coil will comprise a composition which is compatible with the target for a physical vapor deposition process. The coil composition is considered compatible with the target composition if the coil composition does not adversely affect a layer sputter-deposited from the target. The coil composition can, for example, comprise one or more of aluminum, cadmium, cobalt, copper, gold, indium, molybdenum, nickel, niobium, palladium, platinum, rhenium, ruthenium, silver, tin, tantalum, titanium, tungsten, vanadium and zinc. The elements can be in elemental, compound, or alloy form.

In particular aspects, the coil construction 300 can comprise, consist essentially of, or consist of one or more of copper, iron, tantalum, titanium and zirconium. For instance, construction 300 can comprise copper having a purity of at least 99%, by weight, and in some aspects can comprise copper having a purity of at least 99.99%, by weight. Alternatively, coil 300 can comprise titanium having a purity of at least 99%, by weight; zirconium having a purity of at least 99%, by weight; tungsten having a purity of at least 99%, by weight; or tantalum having a purity of at least 99%, by weight. If copper is utilized for the composition of the coil, the copper can, in some aspects, correspond to a composition referred to in the art as an oxygen free element (OFE), which is a composition having very low amounts of oxygen. If the construction comprises iron, the iron can be present as an appropriate alloy or composition, such as, for example, stainless steel.

The assembly of FIG. 7 can correspond to a coil assembly suitable for utilization in the copper 200 mm IMP Electra™ Endura sputtering chamber.

The incorporation of the cup projections and electrode projections into the one-piece coil construction 300 can be considered incorporation of coil peripherals within a one-piece coil construction design. The one-piece design is preferably configured to be utilized in a reaction chamber without modification of the chamber, or in other words to be substituted for a plurality of kit components. Such can have a number of advantages relative to utilization of a conventional coil replacement kit. For instance, there can be better electrical contact between a construction of the present invention relative to prior art constructions in that a number of interfaces between separate components of prior art constructions are eliminated in the construction of the present invention. Also, since many separate machined structures are eliminated in the coil construction of the present invention, there can be a reduced particle count from a product of the present invention relative to prior art constructions due to, for example, elimination of discontinuities along an inner periphery of the coil construction 300 of the present invention.

Figure 8:
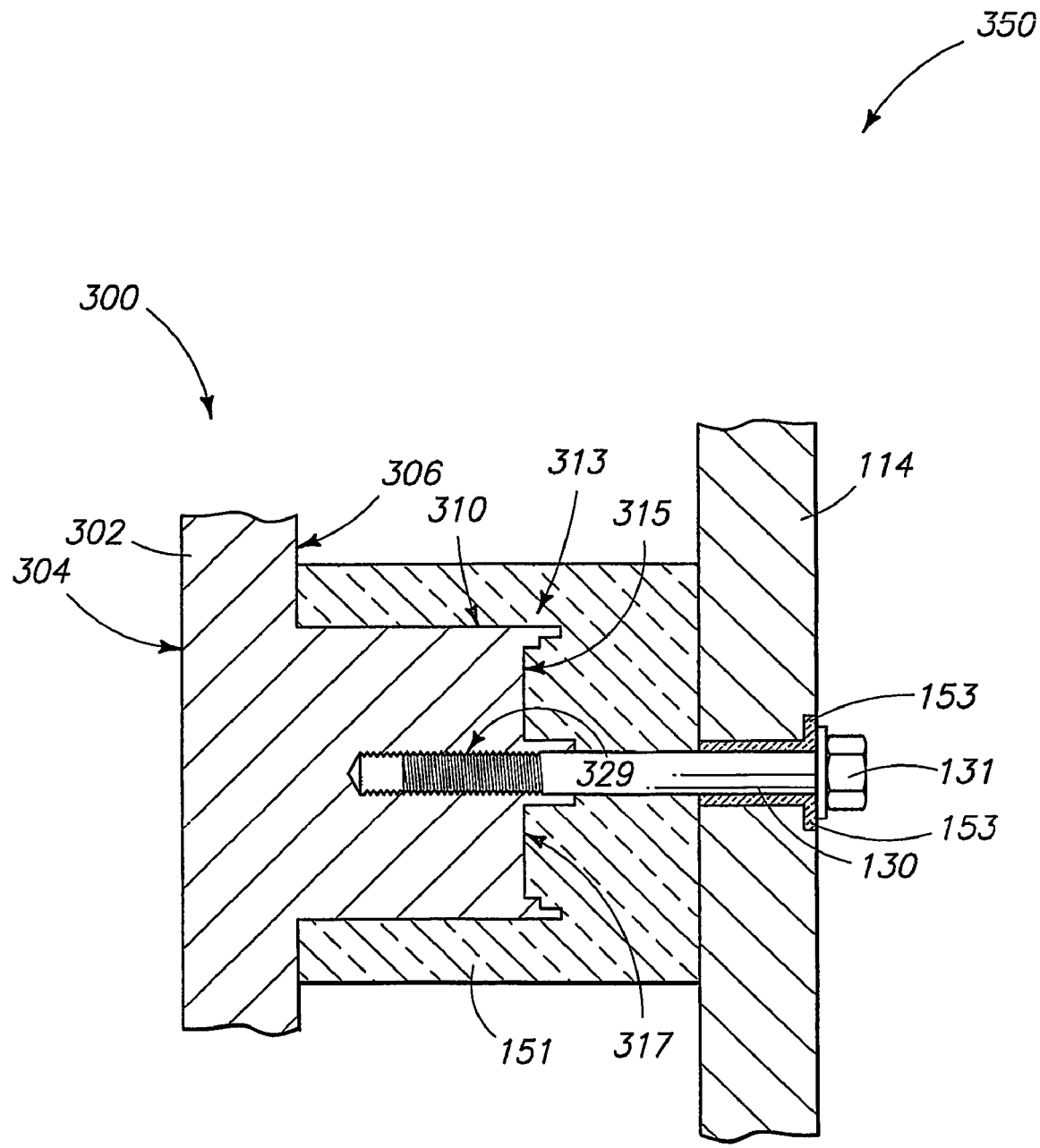
FIG. 8 is a diagrammatic, cross-sectional, fragmentary view of an assembly comprising an exemplary monolithic coil construction of the present invention.

FIG. 8 shows an expanded region of an assembly 350 comprising coil construction 300 attached to a chamber sidewall (also referred to as a shield) 114. The assembly of FIG. 8 is similar to the prior art assembly of FIG. 4, except that the prior art coil/cup construction is replaced with the coil construction of the present invention. In referring to FIG. 8, numbering from FIGS. 4 and 7 will be used, where appropriate.

Figure 1:
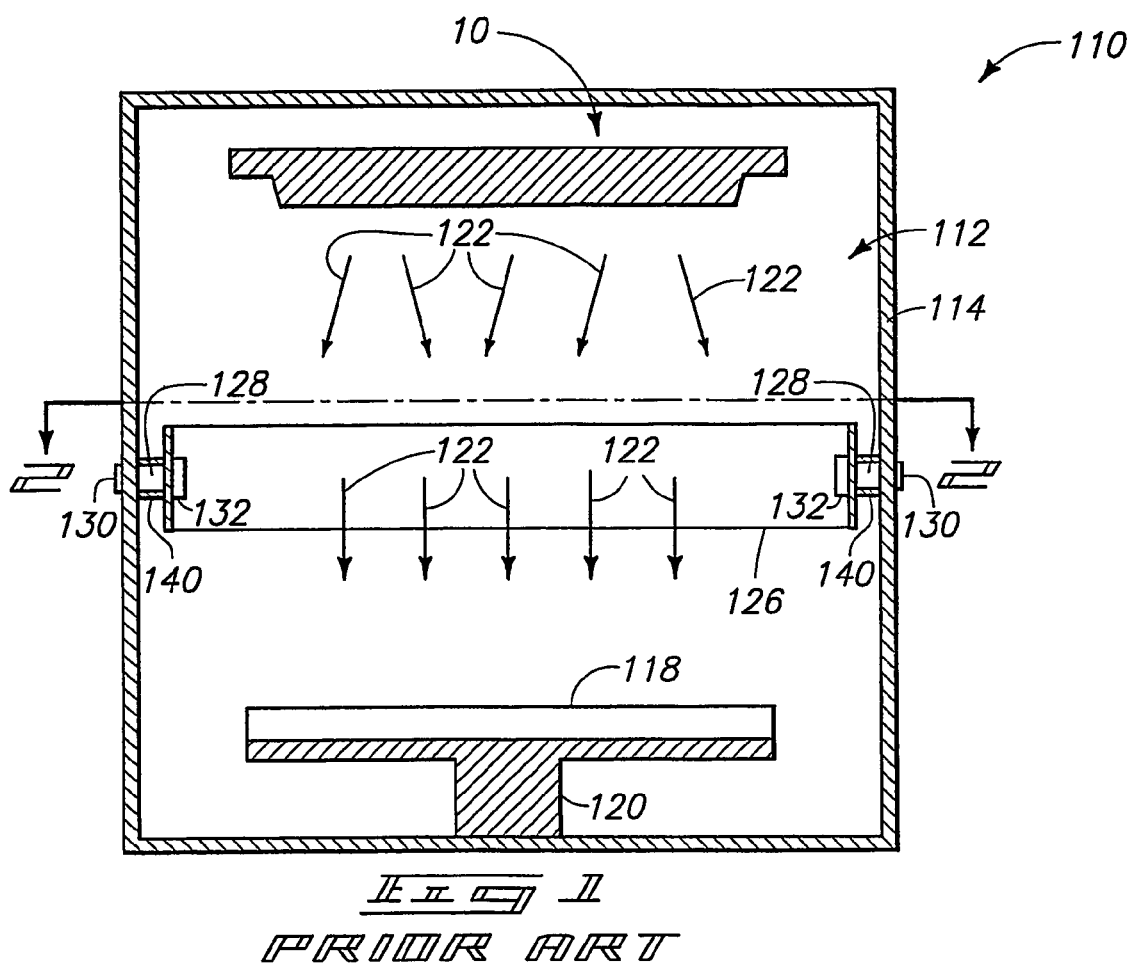
FIG. 1 is a diagrammatic, cross-sectional view of a prior art physical vapor deposition apparatus shown during a physical vapor deposition (e.g., sputtering) process.
Figure 2:
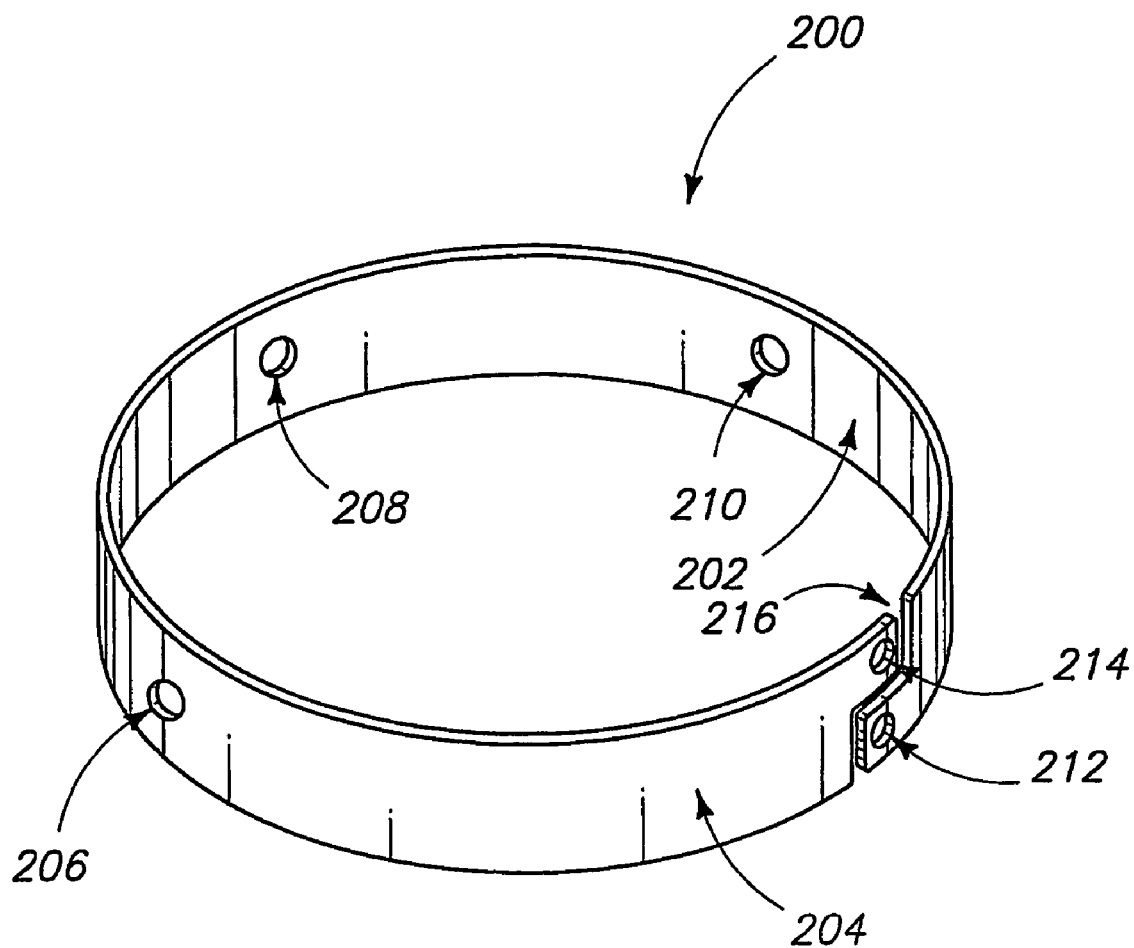
FIG. 2 is a view of an exemplary prior art focusing coil.
Figure 3:
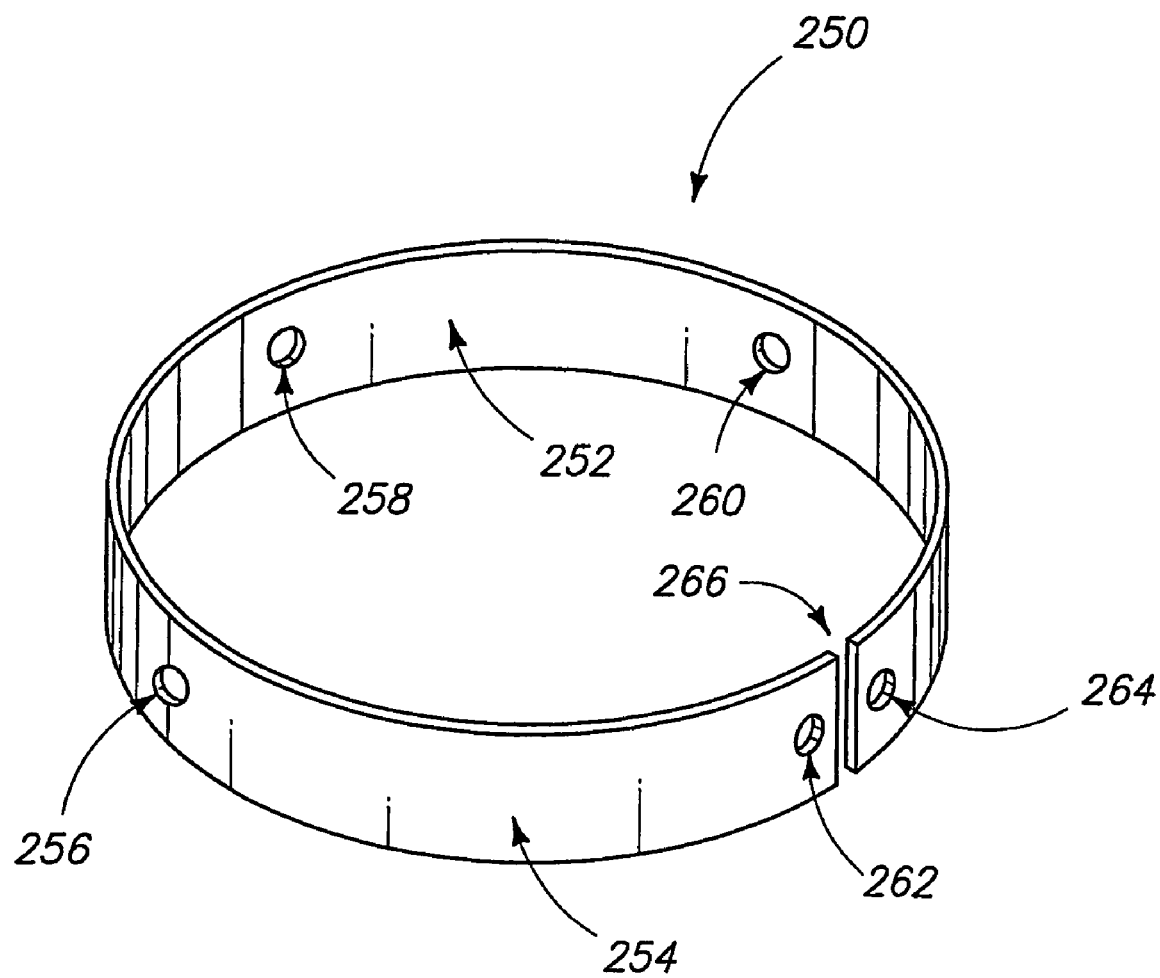
FIG. 3 is a view of another exemplary prior art focusing coil.
Figure 4:
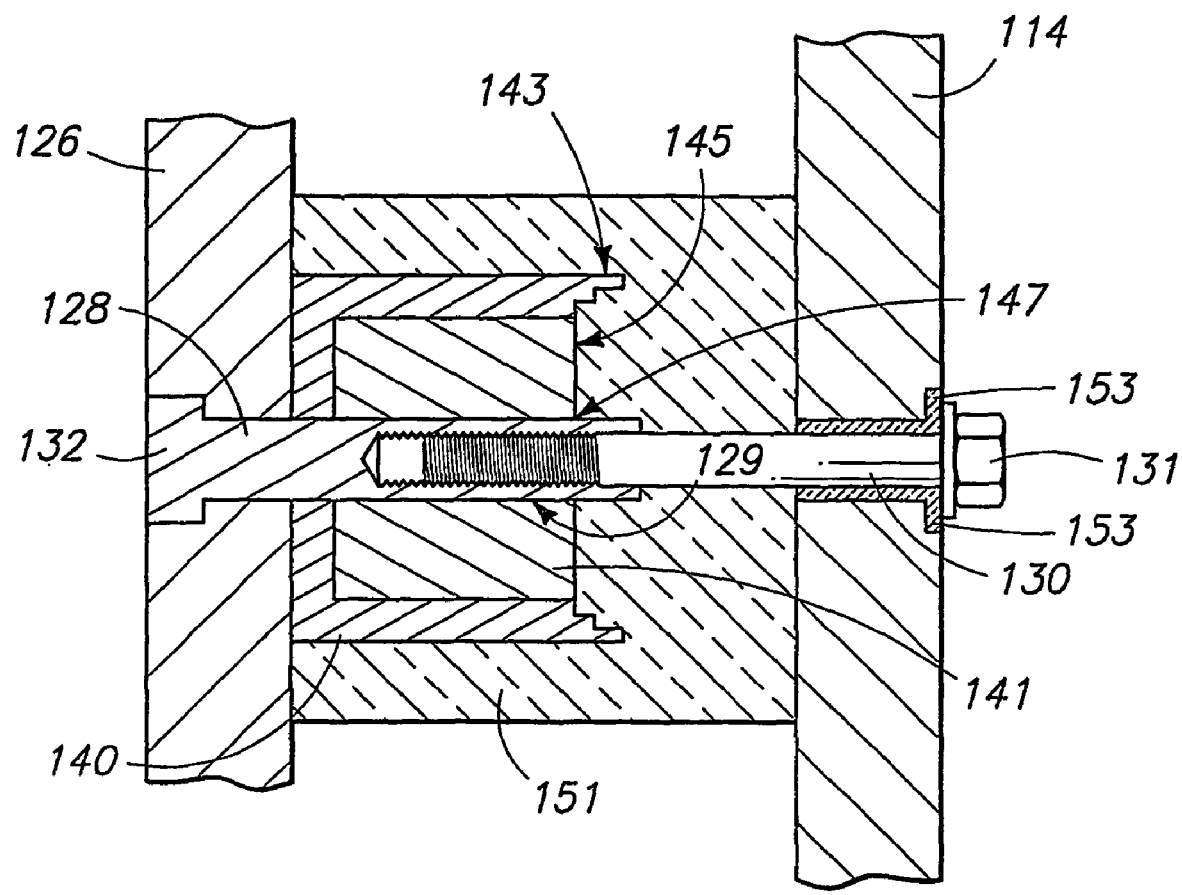
FIG. 4 is a diagrammatic, cross-sectional, fragmentary view of a prior art assembly comprising a focusing coil retained to a sputtering chamber sidewall.
Figure 5:
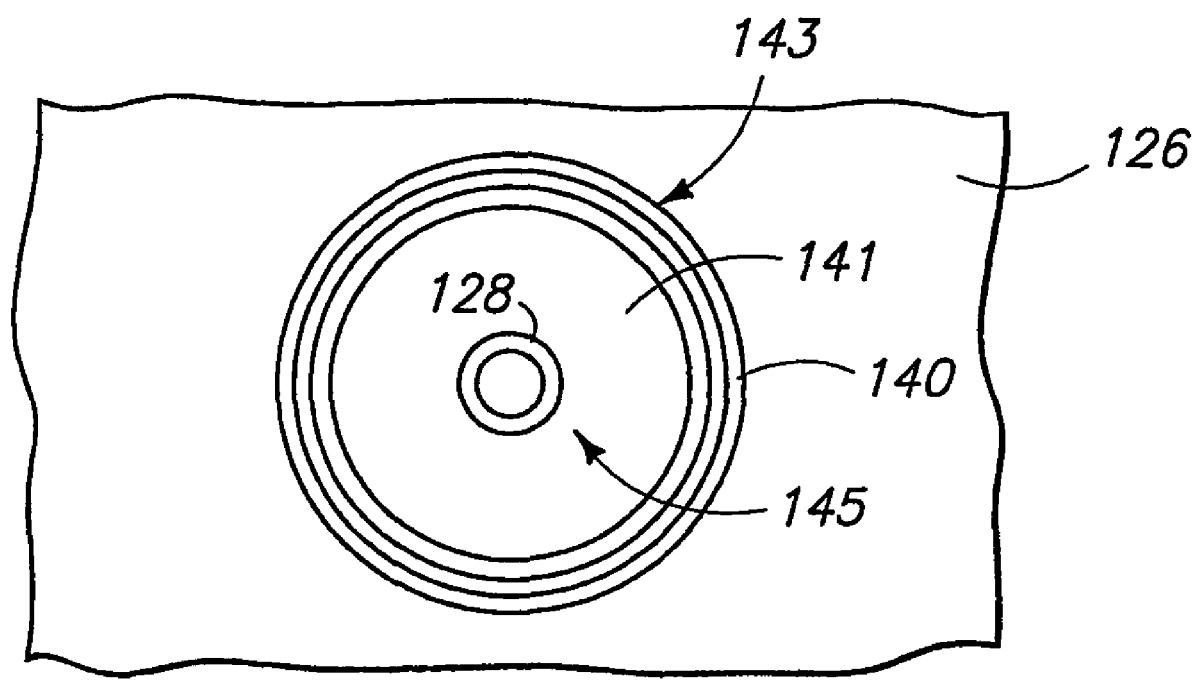
FIG. 5 is a fragmentary side view of a prior art assembly comprising a coil, a cup, and an inner conductive member.

The cross-sectional view of FIG. 8 shows cup projection 310 as one-piece with annular body 302, and accordingly shows that the pin 128 of FIG. 4 is eliminated in the FIG. 8 construction. Such eliminates a discontinuity along an inner periphery of the coil surface. Specifically, the inner periphery of the coil assembly of FIG. 4 has a discontinuity where the head 132 of pin 128 is along the inner periphery of the coil 126, whereas the inner periphery 304 of coil construction 302 has no such discontinuity. Cup projection 310 is shown mimicking the combined shape of cup 140, pin 128 and inner conductor 141 of the FIG. 4 construction. Accordingly, cup projection 310 has a recess 315 extending therein, and a projecting lip 313 extending entirely around the recess. Cup projection 310 further comprises a surface 317 at the bottom of the recess, and an opening 329 extending through the surface 317 (in the shown aspect of the invention the opening is within a projection extending outwardly from surface 317, but regardless the opening extends through the surface). The opening 329 is threaded, and thereby configured to receive the fastener 130 (i.e., the screw 130) utilized to connect coil assembly 300 with shield 114. The opening 329 can be considered a fastener receiver which is within the recess. The ceramic spacer 151 utilized in the prior art construction of FIG. 4 can also be utilized in the construction of FIG. 8, in that the cup projection 310 mimics the dimensions of the combined cup 140 and inner conductor 141 of the prior art construction. In some aspects, the cup projection 310 may be slightly different than the combined cup 140 and conductor 141 so that it may be desirable to modify the configuration of one or both of the dielectrics 151 and 153. In other words, to the extent that a coil construction of the present invention does not mimic the combined components of a coil kit, it may be desirable to modify ceramics (such as dielectrics 151 and 153) to accommodate the coil construction of the present invention within a PVD chamber.

Figure 9:
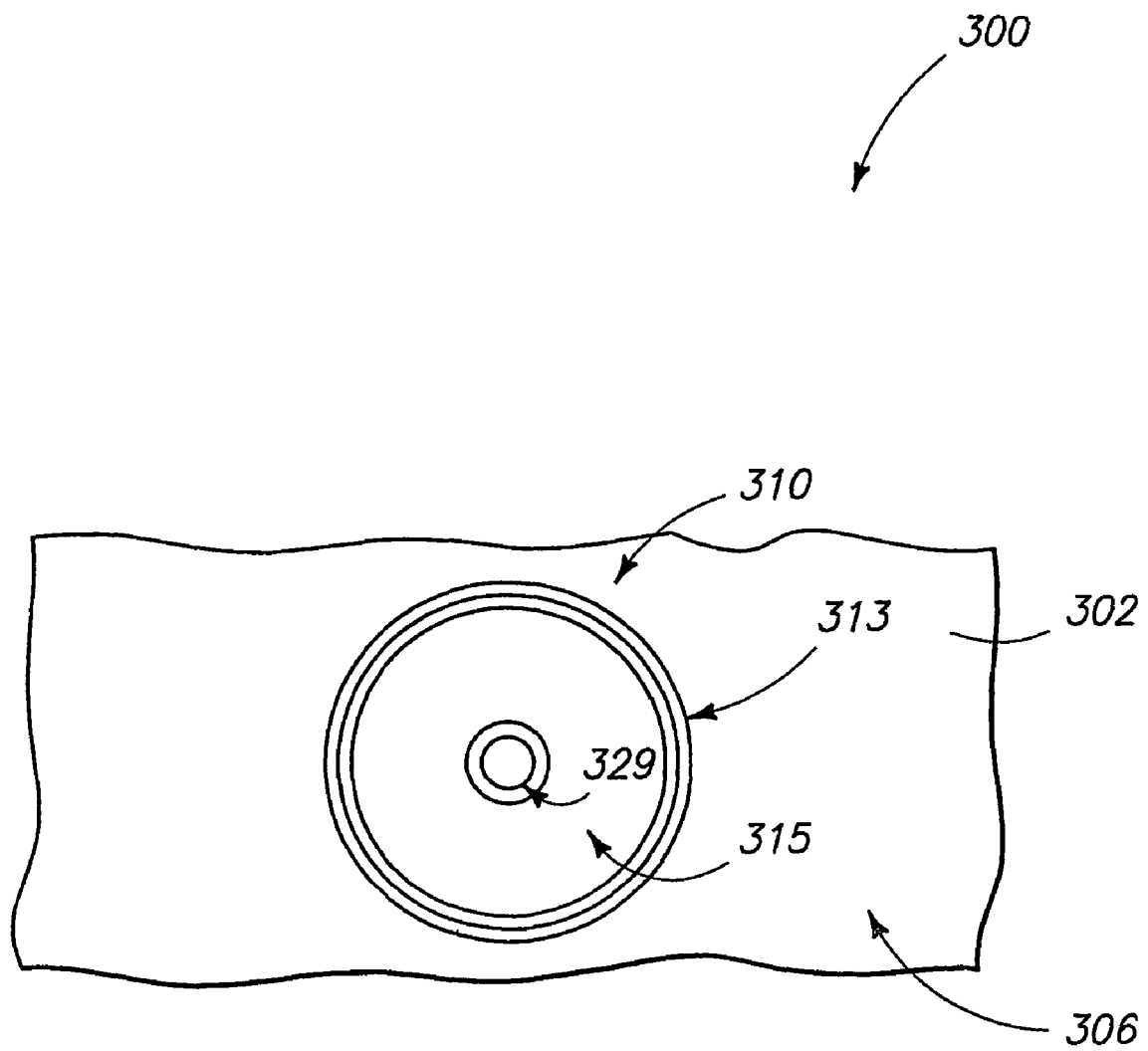
FIG. 9 is a diagrammatic, fragmentary side view of a fragment of an exemplary monolithic coil construction of the present invention.

FIG. 9 is a side view of construction 300 showing that the lip 313 of cup projection 310 extends entirely around the recess 315.

Figure 10:
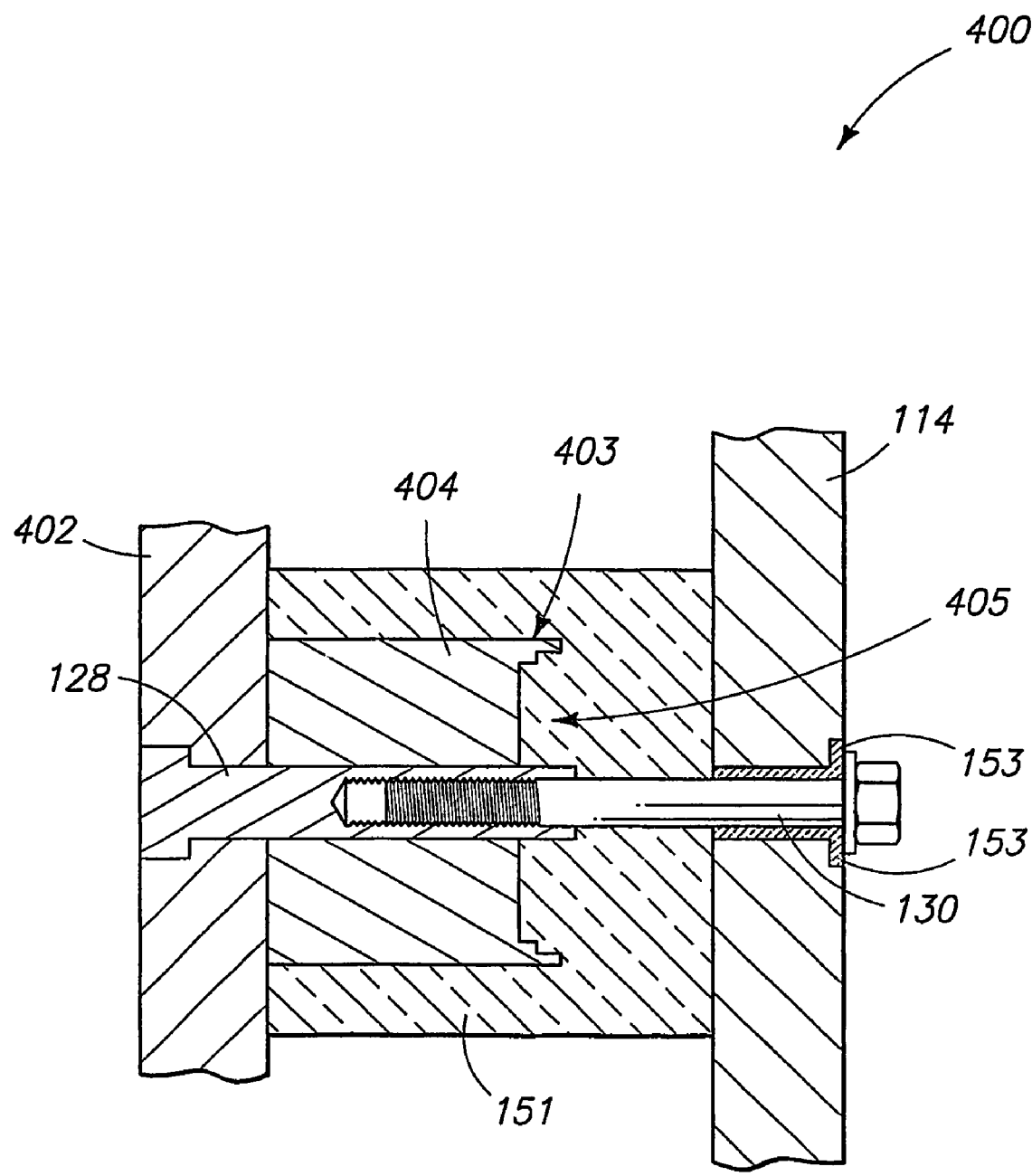
FIG. 10 is a diagrammatic, cross-sectional, fragmentary side view of an assembly comprising a coil adhered to a sidewall in accordance with an aspect of the present invention.

The aspect of the invention described with reference to FIGS. 7-9 has, in a sense, taken all of the metallic components associated with a cup assembly of a coil replacement kit (i.e., the pin, inner conductor and cup) and made them one-piece with the annular focusing coil. It is to be understood, however, that the invention encompasses other aspects in which two or more components of a coil replacement kit are replaced by a one-piece assembly. For instance, one aspect of the invention is to recognize that metallic components of a coil replacement kit include the annular coil, cups, pins and inner conductors, and to form one-piece, constructions which can be substituted for at least two of such components without modification of the physical vapor deposition chamber for which such kit was designed. The replacement construction may, for example, be a construction utilized to substitute for the cup and inner conductor. Such aspect of the invention is shown in FIG. 10 in an assembly 400. In referring to assembly 400, similar numbering will be used as was used above in describing prior art FIG. 4, where appropriate.

The assembly 400 comprises an annular coil body 402. The coil body can be identical to the body 126 of the FIG. 4 construction, or can be a modified body formed in accordance with various aspects of the invention (for instance, the body may be a construction in which electrodes are one-piece with such construction, or in which other cups besides the shown cup are one-piece with the construction). Assembly 400 comprises the shield 114, pin 128, screw 130 and dielectric components 151 and 153 described previously. Construction 400 differs from the construction of FIG. 4 in that the cup and inner conductor components 140 and 141 of FIG. 4 have been replaced by a single one-piece construction 404. Construction 404 has a recess 405 extending therein, and a lip 403 extending entirely around the recess so that the component mimics the combined cup 140 and inner conductor 141 of FIG. 4, and accordingly the component 404 can be substituted directly for the combined cup 140 and inner conductor 141 of the prior art kit assembly.

Figure 11:
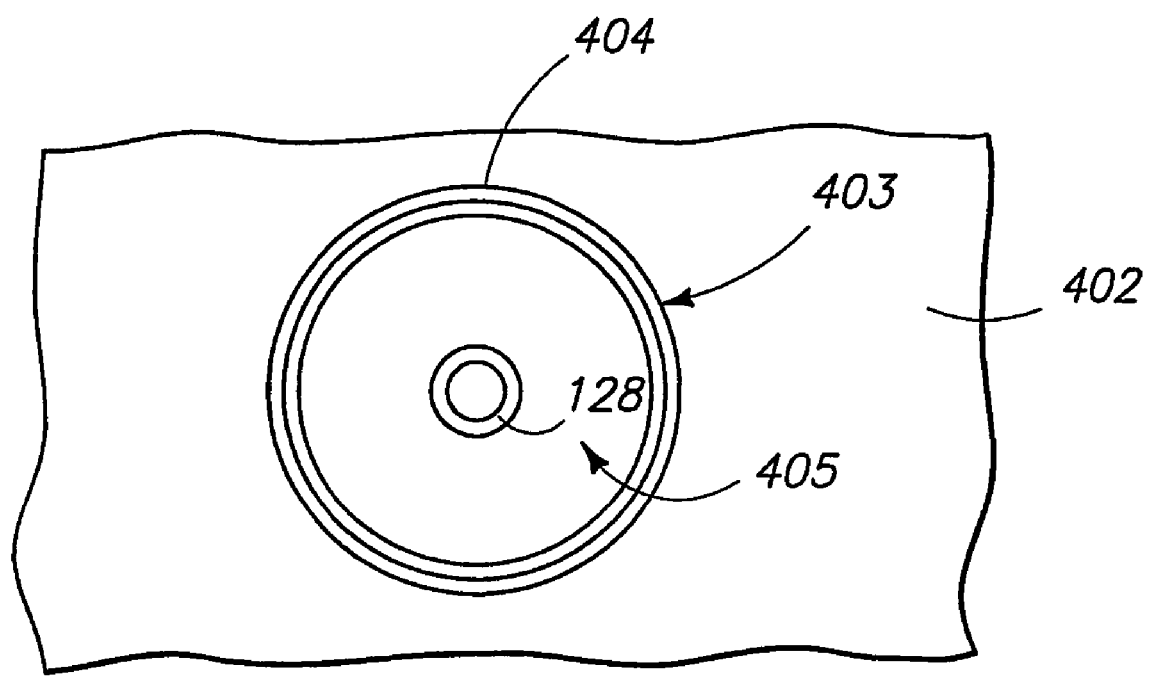
FIG. 11 is a fragmentary side view of a cup and coil assembly of the type utilized in the FIG. 10 construction.

FIG. 11 a side view of an assembly comprising the annular ring 402 and cup projection 403 pinned together with pin 128. Such side view shows that the lip 403 extends entirely around the recess 405 of the cup projection 404.

Figure 6:
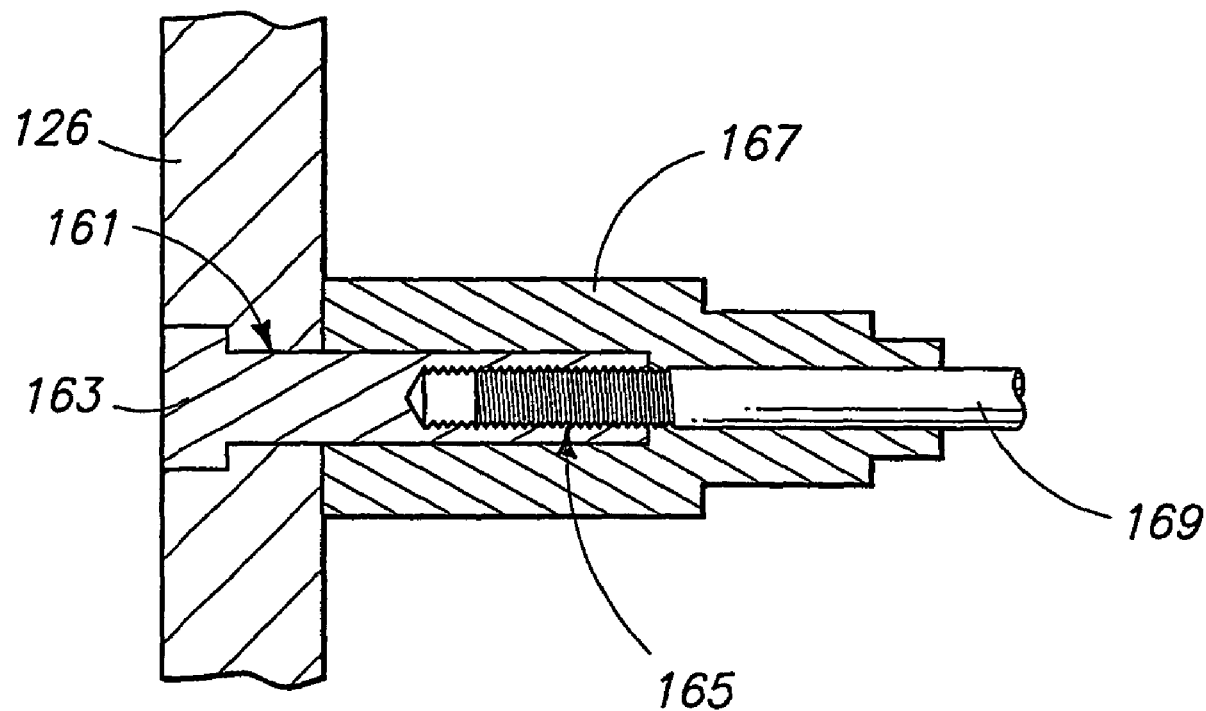
FIG. 6 is a diagrammatic, cross-sectional, fragmentary view of a prior art assembly comprising a coil and components of an electrode associated with the coil.
Figure 12:
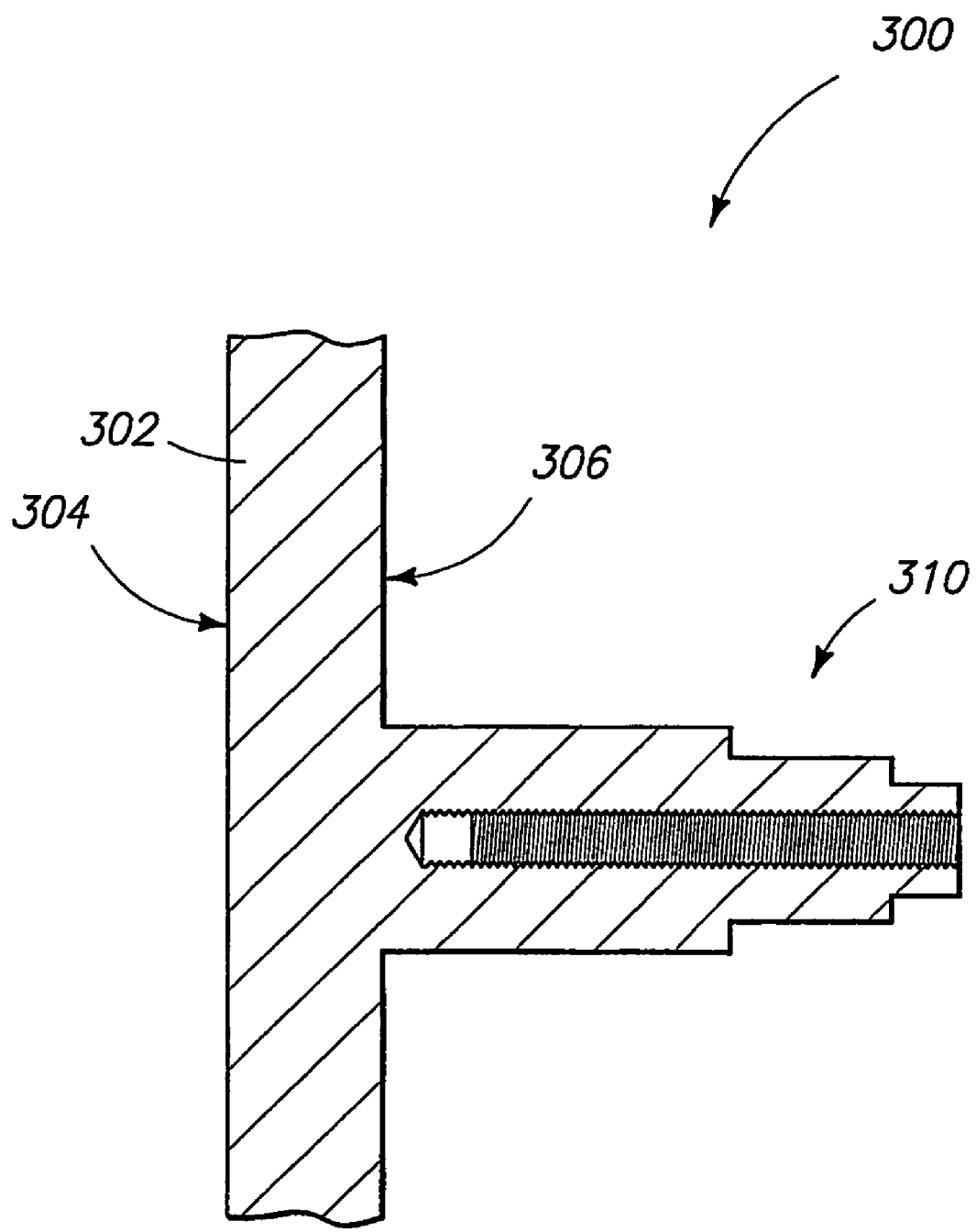
FIG. 12 is a diagrammatic, cross-sectional, fragmentary side view of an electrode portion of a monolithic coil construction formed in accordance with an aspect of the present invention.
Figure 13:
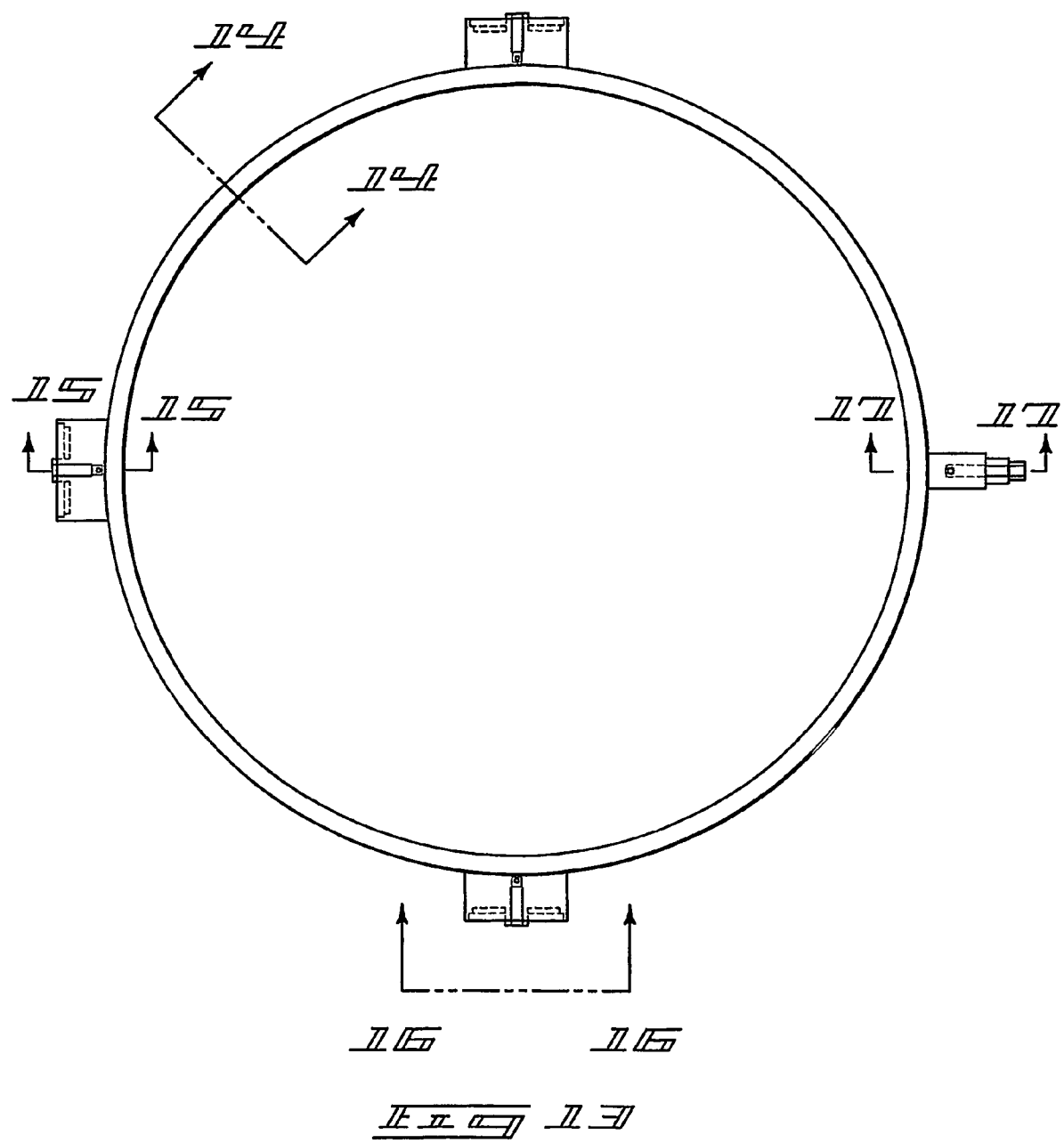
FIGS. 13-17 are diagrammatic views of an exemplary monolithic coil construction formed in accordance with an aspect of the present invention.
Figure 14:
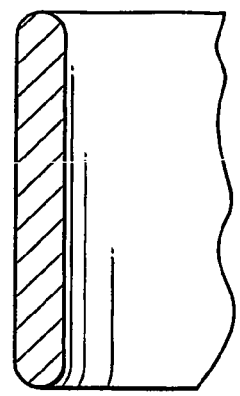

Referring again to the construction 300 of FIG. 7, such has electrode assemblies 312 which are one-piece with the annular coil body 302. FIG. 12 shows an expanded portion of construction 300 in cross-sectional view, and illustrates an exemplary one-piece configuration of the annular coil body and electrode assembly 310. The configuration of FIG. 12 mimics the configuration of FIG. 6, and specifically comprises a one-piece construction replacing the separate components of the coil 126, pin 163, and clamp 167 of the FIG. 6 construction. Accordingly, the FIG. 12 construction 300 can be utilized to replace several separate components of a kit utilized to replace an electrode assembly during replacement of a focusing coil. An advantage of the construction of FIG. 12 is that such eliminates a discontinuity along the inner surface of the coil caused by the prior art utilization of pin 163. The elimination of the pin in forming the one-piece electrode construction of FIG. 12 is similar to the elimination of the pin in forming the one-piece cup construction of FIG. 8. Preferably, both the one-piece cup construction of FIG. 8 and the one-piece electrode construction of FIG. 12 are utilized with a coil construction of the present invention, so that the coil construction has no pins extending through an inner peripheral surface of the annular coil body.

Figure 15:
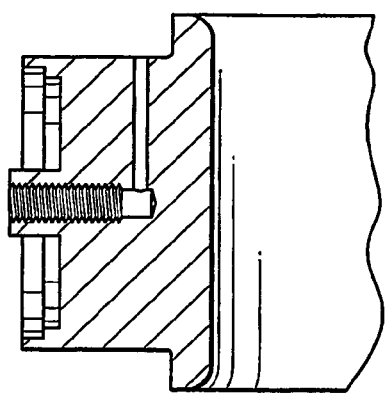
Figure 16:
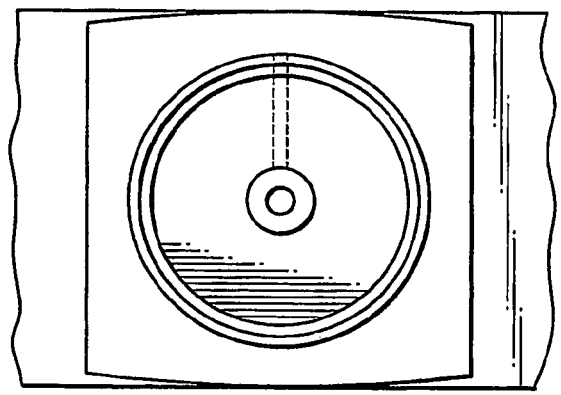
Figure 17:
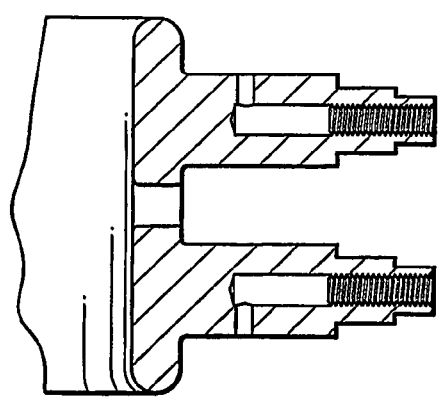

FIGS. 7-9 and 12 diagrammatically illustrate an exemplary monolithic coil construction of the present invention. Further diagrammatic illustrations of an exemplary monolithic coil construction of the present invention are provided in FIGS. 13-17 to assist the reader in understanding the various relationships between exemplary structural elements. The coil body of FIGS. 13-17 can have a height of, for example, from about 1 inch to about 4.5 inches, with about 2 inches being typical. The coil body can have a thickness of, for example, from about 0.01 inches to about 0.5 inches, with about 0.25 inches being typical. The tapped holes of FIGS. 15 and 17 can be any appropriate size, and in some applications will be No. 8 holes (0.164 inch).

The one-piece construction of the present invention can be formed by any suitable process, including forging, machining, casting, etc. Exemplary processes are described in FIGS. 18-21.

Figure 18T:
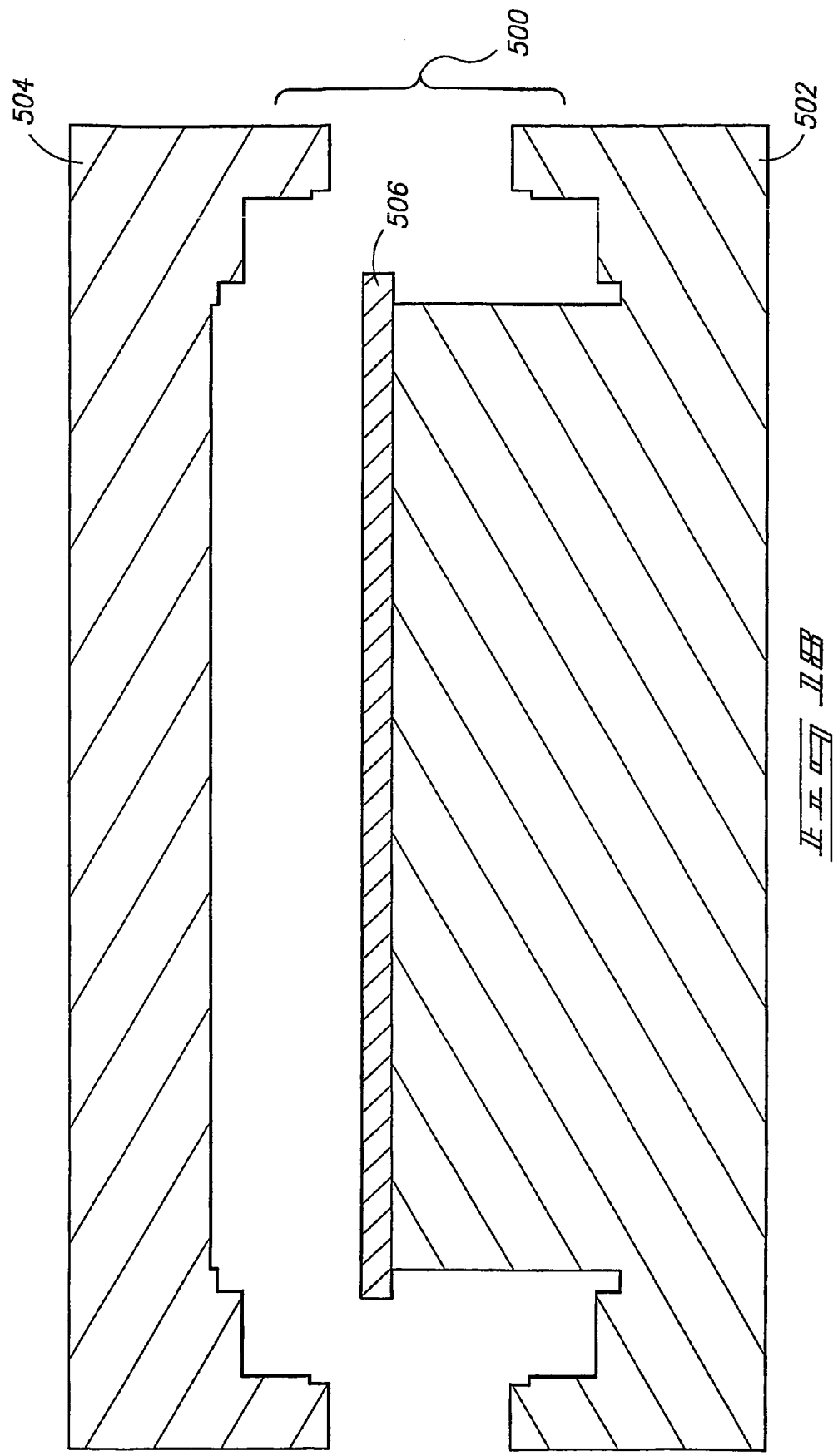
FIG. 18 is a diagrammatic, cross-sectional view of a forge apparatus suitable for utilization in forming a monolithic coil construction of the present invention, and shown at a preliminary processing stage.

Referring initially to FIG. 18, such shows an apparatus 500 at a preliminary processing stage. Apparatus 500 comprises a pair of elements 502 and 504 which are shaped such that when the elements are pressed together they form a mold for a one-piece construction of the present invention. A plate of material 506 is shown provided between elements 502 and 504. Material 506 can comprise any appropriate composition for forming a construction of the present invention.

Figure 19:
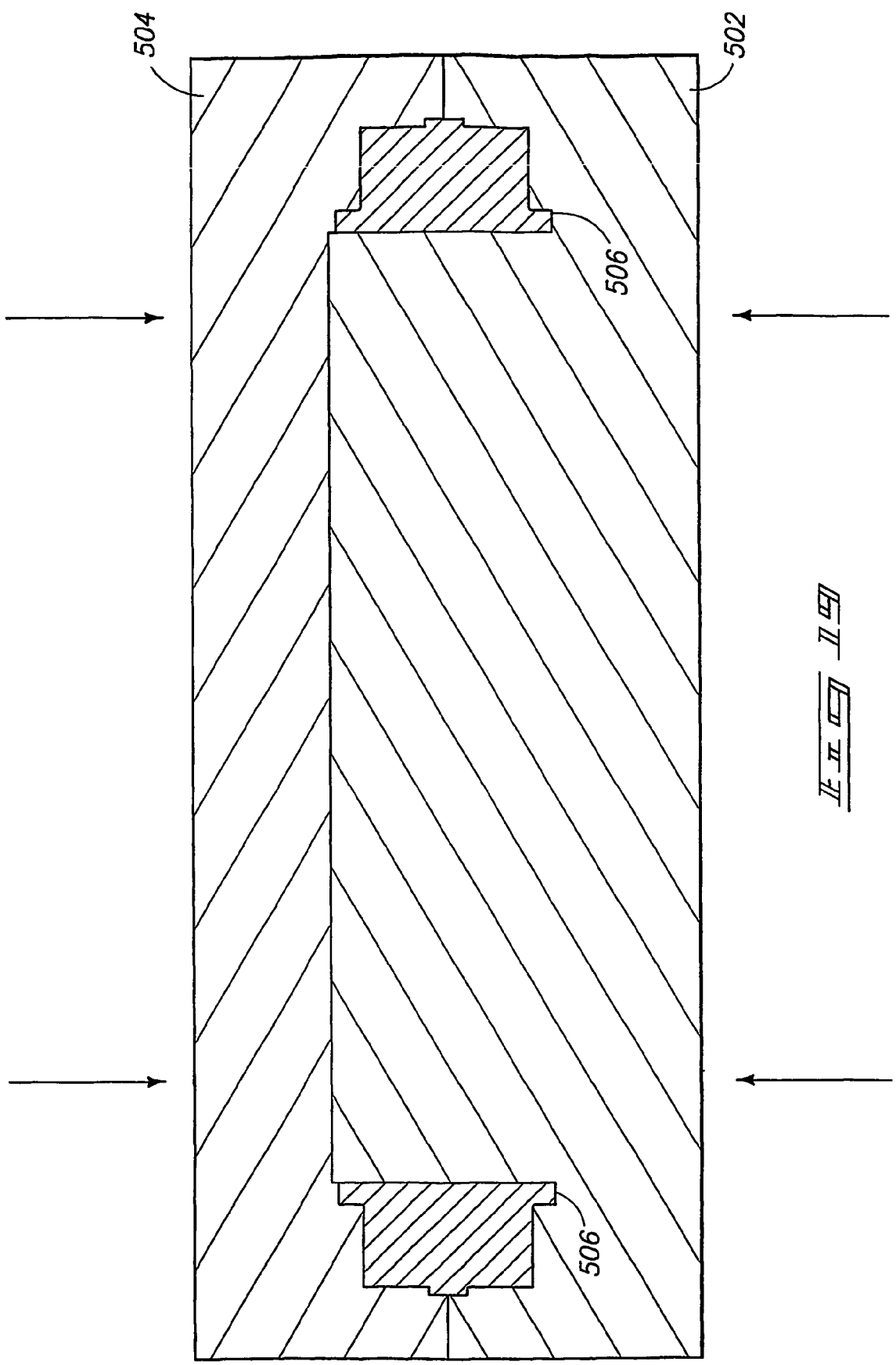
FIG. 19 is a view of the FIG. 18 forge apparatus shown at a processing stage subsequent to that of FIG. 18.

Referring next to FIG. 19, elements 502 and 504 are shown pressed together and the material 506 of the plate is shown formed into a one-piece coil construction of the present invention. Tire processing of FIGS. 18 and 19 can be referred to as a forge process, and can be conducted at any suitable temperature. The one-piece construction resulting from the forging from FIGS. 18 and 19 can be considered to be at least an approximation of a final one-piece coil construction of the present invention. In some aspects, the coil construction resulting from the forging will be suitable for utilization in applications of the present invention as-formed, and in other aspects, the material will closely approximate a construction suitable for utilization, but will not be within desired tolerances until subjected to subsequent machining.

Although the methodology of FIGS. 18 and 19 is shown starting with a solid plate of material 506, it is to be understood that such solid plate can be replaced with other forms of material 506. For instance, material 506 can be provided as a powder, and the pressing to form the desired one-piece construction can be utilized to transform the powder into a solid material having at least an approximation of a desired coil construction.

Figure 20:
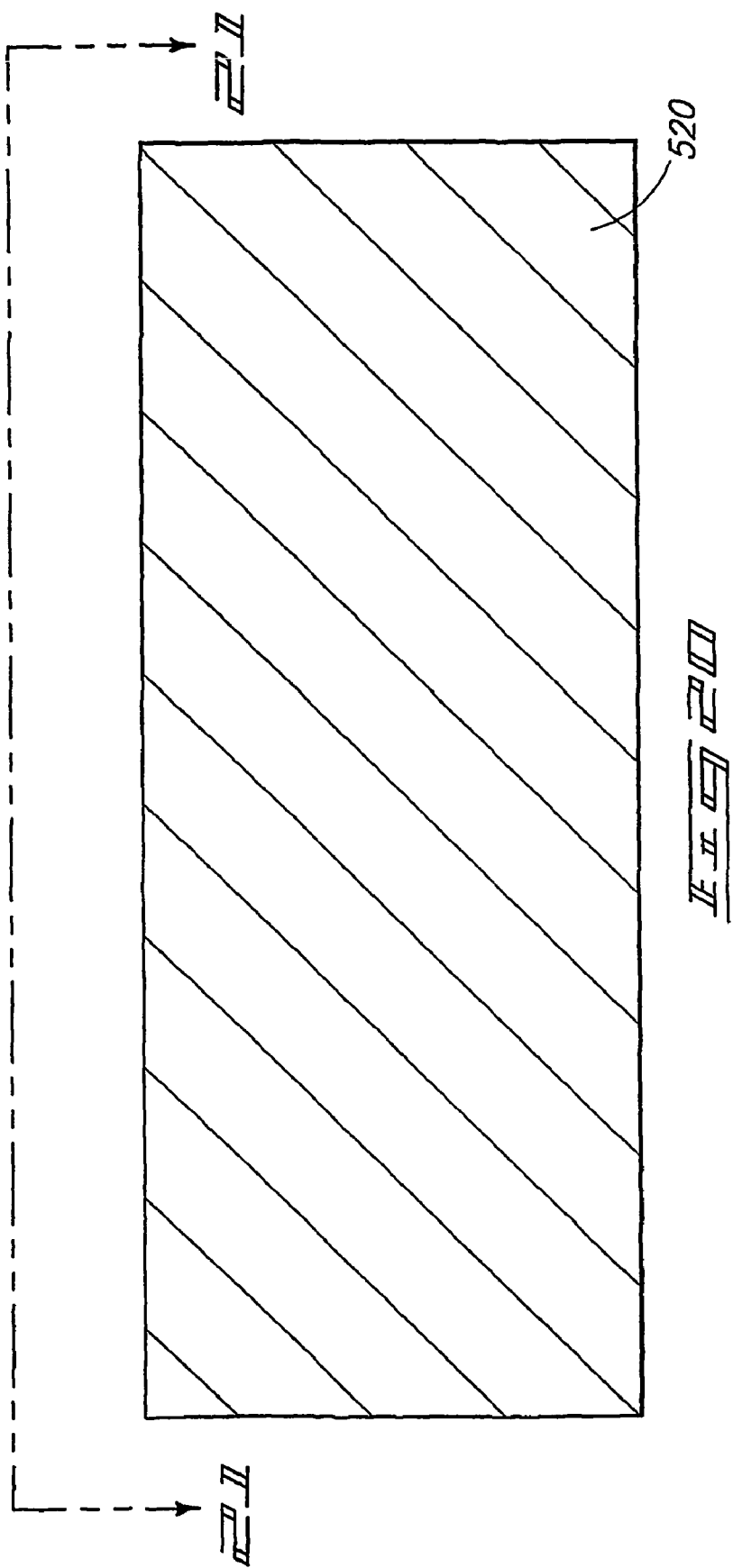
FIG. 20 is a diagrammatic, cross-sectional view of a block suitable for utilization in forming a monolithic coil construction of the present invention.
Figure 21:
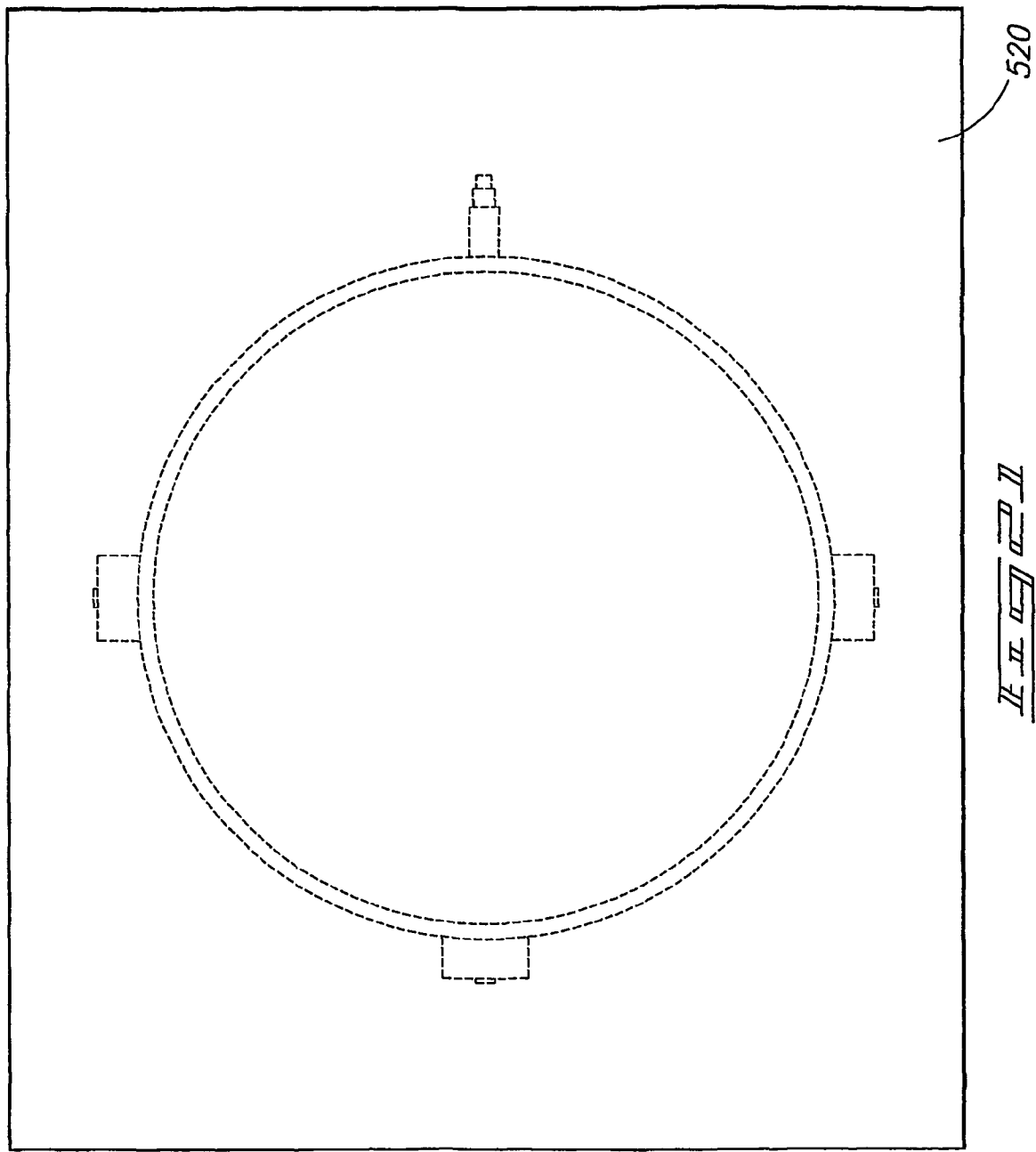
FIG. 21 is a top view of the block of FIG. 20, and shows a dashed line corresponding to a region which can be cut from the block to form a monolithic coil construction in accordance with an aspect of the present invention.

Referring next to FIGS. 20 and 21, a block of material 520 is shown in cross-sectional side view and top view, respectively. The block can comprise any suitable composition for forming a one-piece coil construction of the present invention. The top view of FIG. 21 shows a dashed-line template where a coil construction of the present invention can be cut from within the block. In subsequent processing, the coil construction can be machined from the block with a suitable tool or combination of tools, including, for example, one or both of a saw and punch. The construction machined from block 520 can be at least an approximation of a desired coil construction of the present invention.

Another exemplary process for forming at least an approximation of a desired one-piece coil construction is to directly cast the construction from molten metallic material. Specifically, the molten material is poured into a mold having the appropriate configuration to form at least an approximation of the desired one-piece coil construction.

Various aspects of the invention can be described as follows. A coil of the present invention takes a standard Electra™ 200 millimeter copper coil, and can have all of its peripherals part of one monolithic assembly together with the coil. The monolithic coil can generate less particles during sputtering and can have a longer life. The coil can have a step-in-and-out gap configuration, a side-by-side gap configuration, or any other gap closure geometry. The coil construction of the present invention can be utilized for any size coil, including, but not limited to, the 200 millimeter coil. In some aspects a coil construction of the present invention can be utilized for a 300 millimeter or larger coil.

The drawings of FIGS. 13-17 show a coil utilized for the 200 millimeter copper Endura style sputtering chamber. The coil is used to focus the sputter media within the plasma during sputtering. The coil is in a sense an RF-device-in-the-chamber kit. The coil design of the present invention can eliminate the use of cups, pins, inner conductors and clamps which are utilized in prior art coil designs. The present invention coil of FIGS. 13-17 is monolithic, and fits in the copper 200 mm IMP Electra™ Endura Sputtering Chamber. Among the aspects of the present invention is that the new coil design can be utilized by customers set up to utilize the old coil design without the customers having to change kit types. Additionally, numerous peripheral parts are eliminated, and the coil can reduce particle emission relative to prior art coils, as well as increase coil life, so that the life is approximately 2 to 3 times that of a target.

In some aspects, the invention can be utilized by providing an appropriate coil and installing such in a sputtering kit. The coil is one-piece (monolithic) in particular aspects of the invention, and can be unknurled along the inner periphery, or in some aspects can be knurled or otherwise roughened along the inner periphery to form particle traps. The coil does not have a discontinuous inner diameter created by the recessed pins utilized in prior art designs. Accordingly, the coil can generate less particles than prior art designs. Additionally, an operator utilizing the coil can avoid having to set up numerous pieces typically associated with the prior art coil (one coil, two clamps, five pins, three cups and three inner conductors, for example) since the coil of the present invention is a single piece. The coil of the present invention is believed to have better conductivity through its electrical connections than various prior art designs. The prior art electrical connections are connected to the pins at the gap where they are only touching the coil and are not part of the coil, in contrast to the present invention. Some prior art coils have a typical life of about two targets, whereas a coil of the present invention may have a life of two or three times that of a target.

Coil designs of the present invention can be utilized with numerous target compositions. Typically, the coil will have a composition the same as the target, or purer in a desired material than the target. Accordingly, a coil of the present invention will be formed of highly pure copper in applications in which the coil is to be utilized with a copper target in a sputtering chamber for physical vapor deposition of copper. In contrast, if the coil is utilized with a titanium target, for example, the coil will typically comprise titanium, and if the coil were utilized in a sputtering chamber during tantalum deposition, the coil would typically comprise tantalum. Alternatively, as mentioned above, the coil can comprise a different material than the target, and be compatible to the target for a particular PVD process.

One aspect of the invention can be considered to pertain to monolithic coils in which various peripheral components typically provided as separate pieces with the coil in the prior art are formed to be in a one-piece construction with the coil. Coil constructions of the present invention can preferably be utilized in the chamber directly, and without utilization of a kit for retrofitting either the coil or the chamber.

The invention claimed is:

1. A coil construction configured for utilization in a physical vapor deposition chamber, comprising:
 a one-piece body having at least one cup projection extending from an annular coil, said cup projection having a recess extending therein, and
 the one-piece body including a projecting lip of the cup projection which extends entirely around the recess; and
 the body defining a fastener receiver within the recess and configured to receive a fastener for connecting the annular coil with the chamber, wherein the annular coil, the cup projection and the projecting lip of the cup projection are part of the one-piece body construction.

2. The coil construction of claim 1 wherein the cup projection has a surface at the bottom of the recess, and wherein the fastener receiver is an opening extending through the surface and configured to receive the fastener for connecting the annular coil with the chamber.

3. The coil construction of claim 1 wherein the one-piece body comprises three of the cup projections extending from the annular coil.

4. The coil construction of claim 1 wherein the one-piece body comprises a step-in-and-step-out slit configuration and a pair of clamp constructions on opposing sides of the slit.

5. The coil construction of claim 1 wherein the one-piece body comprises a side-by-side slit configuration and a pair of clamp constructions on opposing sides of the slit.

6. The coil construction of claim 1 wherein the one-piece body comprises a material containing one or more of aluminum, cadmium, cobalt, copper, gold, indium, molybdenum, nickel, niobium, palladium, platinum, rhenium, ruthenium, silver, tin, tantalum, titanium, tungsten, vanadium and zinc in any of elemental, compound or alloy form.

7. The coil construction of claim 1 wherein the one-piece body is copper having a purity of at least 99%, by weight.

8. The coil construction of claim 1 wherein the one-piece body is copper having a purity of at least 99.99%, by weight.

9. The coil construction of claim 1 wherein the one-piece body is titanium having a purity of at least 99%, by weight.

10. The coil construction of claim 1 wherein the one-piece body is zirconium having a purity of at least 99%, by weight.

11. The coil construction of claim 1 wherein the one-piece body is tungsten having a purity of at least 99%, by weight.

12. The coil construction of claim 1 wherein the one-piece body is tantalum having a purity of at least 99%, by weight.

13. The coil construction of claim 1 wherein the one-piece body comprises iron.

14. The coil construction of claim 1 wherein the annular coil is substantially circular.

15. A method of forming a coil construction suitable for utilization in a physical vapor deposition chamber, comprising:
   providing a material; and
   shaping the material into a single piece comprising:
      an annular coil; at least one cup projection extending outwardly from the annular coil; the cup projection having a recess extending therein;
      a projecting lip of the cup projection, the projecting lip extending entirely around the recess, wherein the annular coil, the cup projection and the projecting lip of the cup projection are part of the one-piece body construction; and
      a fastener receiver within the cup projection and configured to receive a fastener for connecting the annular coil with the chamber.

16. The method of claim 15 wherein the material is a block, and wherein the shaping comprises removing at least an approximation of said single piece from the block.

17. The method of claim 15 wherein the material is a plate, and wherein the shaping comprises forging at least an approximation of said single piece from the plate.

18. The method of claim 15 wherein the material is a powder, and wherein the shaping comprises pressing the powder into at least an approximation of said single piece.

19. The method of claim 15 wherein the material is a molten liquid, and wherein the shaping comprises pouring the liquid into a mold to cast the material into at least an approximation of said single piece.

20. The method of claim 15 wherein the material comprises one or more of copper, titanium, zirconium, tungsten, tantalum and iron.

21. The method of claim 15 wherein the material comprises at least 99% copper, by weight.

22. The method of claim 15 wherein the material comprises at least 99% titanium, by weight.

23. The method of claim 15 wherein the material comprises at least 99% zirconium, by weight.

24. The method of claim 15 wherein the material comprises at least 99% tungsten, by weight.

25. The method of claim 15 wherein the material comprises at least 99% tantalum, by weight.

26. The method of claim 15 wherein the material comprises iron.

27. The method of claim 15 wherein the annular coil is substantially circular.

* * * * *